(12) United States Patent
Krivokapic et al.

(10) Patent No.: US 6,448,120 B1
(45) Date of Patent: Sep. 10, 2002

(54) TOTALLY SELF-ALIGNED TRANSISTOR WITH TUNGSTEN GATE

(75) Inventors: Zoran Krivokapic, Santa Clara; Ognjen Milic, Burlingame, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 09/837,152

(22) Filed: Apr. 17, 2001

Related U.S. Application Data

(62) Division of application No. 09/103,388, filed on Jun. 24, 1998, now Pat. No. 6,246,096.

(51) Int. Cl.⁷ .................... H01L 21/338; H01L 21/336; H01L 21/3205; H01L 21/4763
(52) U.S. Cl. .................. 438/174; 438/167; 438/180; 438/301; 438/302; 438/592
(58) Field of Search ................. 43/8; 438/167, 438/174, 180, 301, 302, 592

(56) References Cited

U.S. PATENT DOCUMENTS

| | | | |
|---|---|---|---|
| 4,701,423 A | 10/1987 | Szluk | |
| 4,868,135 A | 9/1989 | Ogura et al. | |
| 4,889,827 A | * 12/1989 | Willer | |
| 5,001,076 A | * 3/1991 | Mikkelson | |
| 5,081,516 A | 1/1992 | Haskell | |
| 5,182,218 A | * 1/1993 | Fujihira | |
| 5,399,507 A | * 3/1995 | Nowak | |
| 5,494,837 A | 2/1996 | Subramanian et al. | |
| 5,580,803 A | * 12/1996 | Oh et al. | |
| 5,736,453 A | 4/1998 | Venkatesan et al. | |
| 5,918,130 A | * 6/1999 | Hause et al. | |
| 6,037,625 A | 3/2000 | Matsubara et al. | |
| 6,117,713 A | * 9/2000 | Hoshino et al. | |

OTHER PUBLICATIONS

Article entitled, "Spatially Confined Nickel Disilicide Formation at 400°C On Ion Implantation Preamorphized Silicon" Author: Erohkin et al.

* cited by examiner

Primary Examiner—John F. Niebling
Assistant Examiner—Ron Pompey
(74) Attorney, Agent, or Firm—Eschweiler & Associates, LLC

(57) ABSTRACT

A totally self-aligned transistor with a tungsten gate. A single mask is used to align the source, drain, gate and isolation areas. Overlay error is greatly reduced by the use of a single mask for these regions. A mid-gap electrode is also self-aligned to the transistor. The electrode is preferably formed from tungsten metal.

6 Claims, 2 Drawing Sheets

TOTALLY SELF-ALIGNED TRANSISTOR WITH TUNGSTEN GATE

This application is a division of application Ser. No. 09/103,388, filed Jun. 24, 1998, which is hereby incorporated by reference herein. Now U.S. Pat. No. 6,246,096.

BACKGROUND OF THE INVENTION

Precision is very important in the manufacture of semiconductor integrated circuits. Semiconductor integrated circuits commonly include many transistors and active devices that are formed by implanting, depositing and etching certain substances onto the surface of a substrate. The most commonly used substrate for the manufacture of semiconductor integrated circuits is silicon, although those skilled in the art will recognize that many other known and as yet unknown substances can be used for a substrate.

The implanting, depositing and etching process steps are used in the formation of the multi-layer structure that makes up the semiconductor integrated circuit. The technique typically used to implant, deposit and etch employs a series or set of masks that expose or open windows to the surface of the semiconductor integrated circuit in formation. It is not uncommon to require dozens of different masks to implant, deposit and etch the various layers created in the multi-layer structure. Today, these structures can include, for example, three, four or even five layers of metal interconnect in addition to the active devices included in the semiconductor integrated circuit.

As the size, and accordingly the device geometries, of these semiconductor integrated circuits continues to shrink, one problem that emerges is the alignment of the many masks used in the manufacturing process. In the manufacture of sub-micron devices common today, such as 100 nanometer transistors, the alignment of the mask sets used in the manufacturing process can become critical to the operation of the resulting circuits. Improperly aligned or misaligned masks can prevent device operation and thus reduce the yield of the semiconductor integrated circuits manufactured.

One common mask alignment problem is the degree of overlay between different masks in a multiple mask set. Misalignment between successive masks used in the manufacture of the semiconductor integrated circuit can produce an overlay error that may ultimately result in the failure of the circuits to operate properly. Specifically, this overlay error may cause significant differences in the source and drain areas defined for these semiconductor integrated circuits.

Overlay error between the source/drain mask, which is used to define the isolation area between the active areas, and the poly/gate mask thus becomes critical.

In order to reduce the alignment problems created by the use of multiple mask sets, certain self-alignment techniques have been attempted. What is lacking in the art is a totally self-aligned transistor and a method for making the self-aligned transistor where the gate, source, drain and isolation area of the device are all self-aligned using a single mask. What is also lacking is the provision of a mid-gap electrode in such a self-aligned transistor.

BRIEF SUMMARY OF THE INVENTION

In view of the above, a totally self-aligned transistor with tungsten gate and method for making same is provided. According to the device of the invention, the totally self-aligned transistor with tungsten gate includes a substrate layer and at least one silicon trench, the at least one silicon trench defining a plateau region in the substrate layer. An oxide layer is disposed in the at least one silicon trench, and oxide spacers are disposed on a top surface of the plateau region. The oxide spacers define gate, source and drain areas. At least one channel dopant is deposited in the substrate layer on the top surface thereof. Silicide layers are disposed in the source and drain areas between the oxide spacers. A metal layer is deposited in the gate area above the at least one channel dopant and in the source and drain areas above the silicide layers.

According to the method of the invention, a totally self-aligned transistor with tungsten gate is formed by providing an integrated circuit semiconductor structure comprising a substrate layer, a first oxide layer deposited over the substrate, a first nitride layer deposited over the first oxide layer, a second oxide layer deposited over the first nitride layer, and a second nitride layer deposited over the second oxide layer. A photoresist layer is deposited in a predetermined pattern over the integrated circuit semiconductor structure. The second nitride layer is then etched in those areas not covered by the photoresist layer to create at least one nitride island. The integrated circuit semiconductor structure is also etched to create at cast one silicon trench. An oxide layer is deposited in the silicon trench to a level of the first nitride layer. The first nitride layer, the first oxide layer and the at least one nitride island are etched to form gate, source and drain areas, and at least one channel dopant is deposited in the gate area of the substrate layer. A silicide layer is then provided over the source and drain areas, and a metal layer is deposited in the gate, source and drain areas.

As can be seen, the present invention provides a totally self-aligned transistor that reduces or eliminates the overlay error caused by the use of multiple mask sets in the formation of semiconductor integrated circuits. The present invention provides a totally self-aligned transistor where the source, gate and drain of the transistor are all aligned to the isolation area of the device through the use of a single mask to form each of these elements. Deposition of tungsten in the gate area of this device also provides a mid-gap electrode for the totally self-aligned transistor. The present invention thus helps to improve device density and shrink the overall size of semiconductor integrated circuits, as well as add new functionality to such devices.

These and other features and advantages of the invention will become apparent to those skilled in the art upon a review of the following detailed description of the presently preferred embodiments of the invention, taken in conjunction with the appended drawings.

DETAILED DESCRIPTION OF THE PRESENTLY PREFERRED EMBODIMENTS OF THE INVENTION

Figure 1:
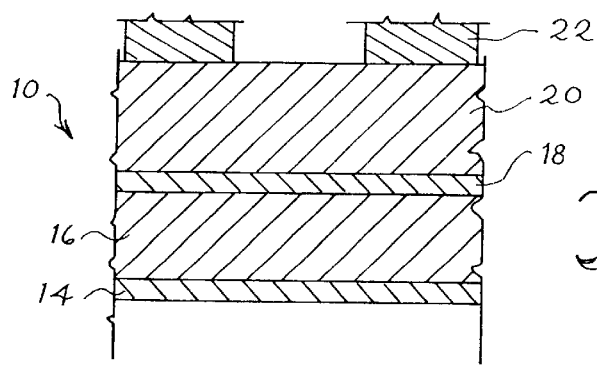
FIG. 1 illustrates a cross-sectional view of one presently preferred embodiment of the invention showing a photoresist layer deposited over a double silicon nitride/silicon dioxide structure.

Referring now to the drawings, where like reference numerals refer to like elements throughout, a totally self-aligned transistor with tungsten gate 10 is shown generally in FIG. 1. In forming the totally self-aligned transistor 10, a first thin silicon dioxide ($SiO_2$) layer 14 is preferably deposited over a silicon (Si) substrate 12. The first thin silicon dioxide layer 14 is preferably formed to a thickness of 5–10 nanometers. A first silicon nitride ($Si_3N_4$) layer 16 is then deposited over the first thin silicon dioxide layer 14. The first silicon nitride layer 16 is preferably formed to a thickness of 200–250 nanometers. A second silicon dioxide layer 18 is then deposited to a thickness of approximately 10–20 nanometers on top of the first silicon nitride layer 16. A second silicon nitride layer 20 is deposited to a thickness of 200–250 nanometers over the second silicon dioxide layer 18.

Figure 2:
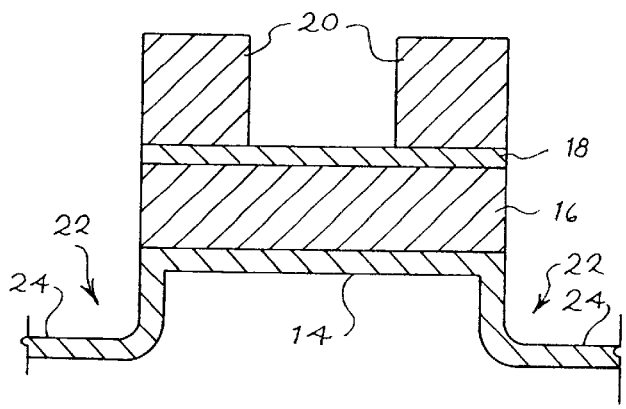
FIG. 2 is a cross-sectional view of the structure shown in FIG. 1 after the second nitride layer has been etched to create silicon trenches.
Figure 3:
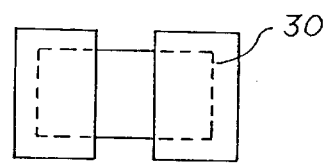
FIG. 3 is a top plan view of the alignment of the active area mask used in connection with FIG. 2.

A photoresist mask (not shown) is used to deposit photoresist 22 is a predetermined manner over the second silicon nitride layer 20. As shown in FIG. 2, the second silicon nitride layer 20 is then etched in those areas not covered by the photoresist 22 to reveal or create two nitride islands 20. On either side of the nitride islands 20, the second silicon dioxide layer 18, first nitride layer 16 and first thin silicon dioxide layer 14 are also etched to form silicon trenches 22. The silicon trenches 22 are formed through the etch process where the etch is allowed to continue down into the silicon substrate 12. An active area mask 30 is used to pattern the silicon trenches 22 (see FIG. 3) while protecting the second silicon dioxide layer 18, the first nitride layer 16 and the first thin silicon dioxide layer 14. A top plan view of the positioning of the active area mask 30 is generally shown in FIG. 3. A thin thermal oxide layer 24 is then deposited in the silicon trenches 22, preferably to a thickness of 5–10 nanometers.

Figure 4:
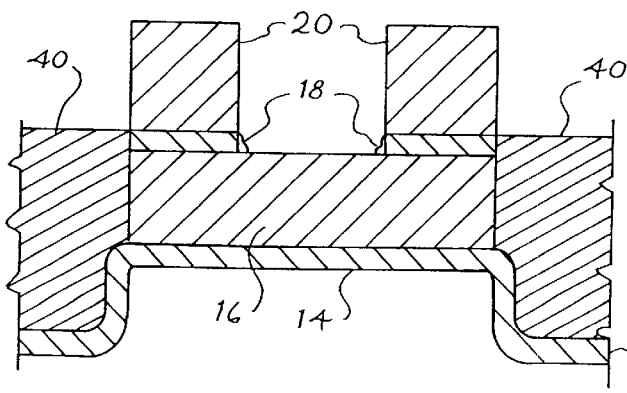
FIG. 4 is a cross-sectional view of the deposition of a trench oxide layer deposited in the silicon trenches of FIG. 2.

Referring now to FIG. 4, an oxide deposition layer 40 is deposited to a thickness of preferably 1–1.5 micrometers. This trench oxide layer 40 is deposited in the silicon trenches 22 shown in FIG. 2, and is then polished back to the top of the second nitride layer 20. The trench oxide layer 40 is then etched through the second nitride layer 20 and through the second silicon dioxide layer 18 to stop at the top of the first nitride layer 16.

Figure 5:
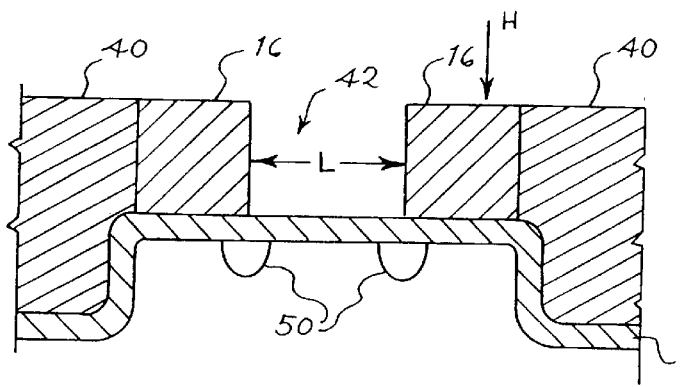
FIG. 5 is a cross-sectional view of the etching of the first and second nitride layers to define a gate opening.

The nitride islands 20 and the nitride layer 16 are then etched back as shown in FIG. 5. Channel dopants 50 are implanted in the channel area 42, as shown in FIG. 5. Preferably, a tilt implant technique is used to deposit the channel dopants 50. In the presently preferred embodiment of the invention, the tilt angle used for the implant is determined according to the following equation:

$$2 = \text{Arc tan}(L/H)$$

As those skilled in the art will appreciate, in the above equation, L is used to refer to the thickness or length of the channel opening (see FIG. 5), and H is used to refer to the height of the first nitride layer 16.

Figure 6:
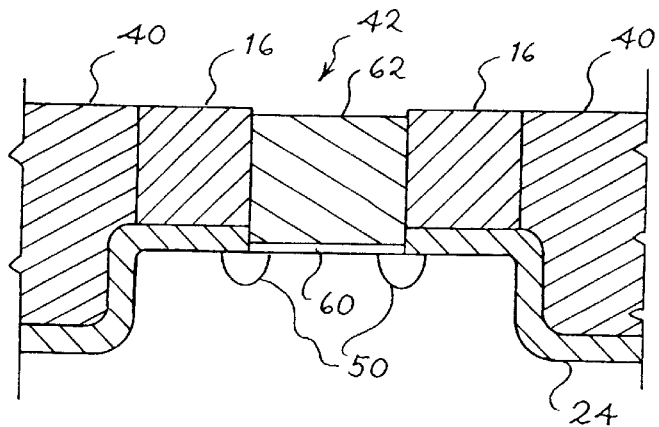
FIG. 6 is a cross-sectional view showing the deposition of a tungsten gate and channel dopants.

Referring now to FIG. 6, a gate oxidation layer 60 is deposited, preferably to a thickness of 1–1.25 nanometers, in the channel area 42 followed by a 1.0 nanometer layer of silicon nitride (not shown). Alternatively, a 3.0 nanometer layer of silicon nitride can be deposited using jet vapor deposition techniques generally known in the art. A layer of Tungsten (W) 62 is then deposited in the gate area 42 over the gate oxidation layer 60, preferably to a thickness of 1–2.5 nanometers. Although tungsten is preferred as a midgap electrode, due to its ability to withstand high temperatures in subsequent processing, those skilled in the art will appreciate that silicon germanium and other refractory metals like tantalum can be employed without depositing from the essential spirit and scope of the invention. The tungsten layer 62 is also polished back to the level of the nitride layer 16.

Finally, the nitride layer 16 is removed and an LDD implant 70 is deposited in the source and drain areas. Another oxide layer (not shown) is then deposited in the source and drain regions. Oxide spacers 74 are thereby formed, preferably to a thickness of 40–60 nanometers. Silicidation is performed in the areas of the source and drain according to a process generally known in the art. One presently preferred silicidation process is disclosed in co-pending application Ser. No. 09/093,580, filed on Jun. 8, 1998, entitled, Self-Aligned Soi Device With Body Contact And $NiSi_2$ Gate, and commonly owned by the assignee of the present application, the contents of which are hereby incorporated herein by reference.

Figure 7:
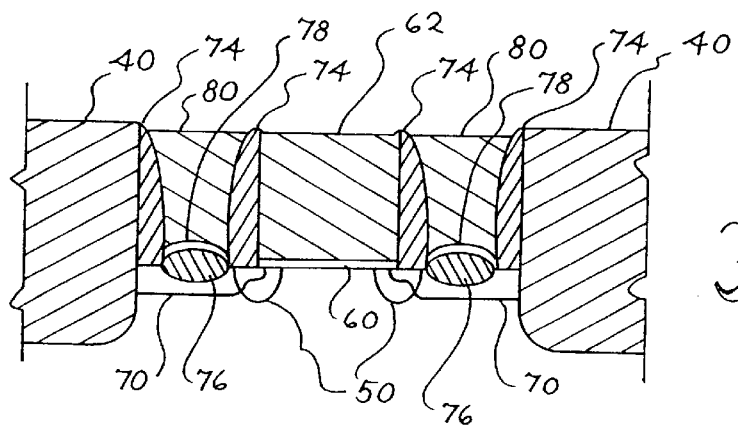
FIG. 7 is a cross-sectional view of one presently preferred embodiment of the totally self-aligned transistor with tungsten gate.

Titanium nitrate (TiN) 78 is deposited over the silicidation areas 76. Another layer of tungsten (W) 80 is then deposited over the titanium nitrate layer 78, and the tungsten layer 80 is also polished back to the level just below the height of the oxide spacers 74. A cross section of the totally self-aligned transistor with tungsten gate 10 is therefore shown in FIG. 7.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method for forming a totally self-aligned transistor with tungsten gate, comprising the steps of:

providing an integrated circuit semiconductor structure comprising a substrate layer, a first oxide layer deposited over the substrate, a first nitride layer deposited over the first oxide layer, a second oxide layer deposited over the first nitride layer, and a second nitride layer deposited over the second oxide layer;

depositing a photoresist layer in a predetermined pattern over the integrated circuit semiconductor structure;

etching the second nitride layer in areas not covered by the photoresist layer to create at least one nitride island;

etching the integrated circuit semiconductor structure to create at least one silicon trench;

depositing an oxide layer in the silicon trench, the oxide layer deposited to a level of the first nitride layer;

etching the first nitride layer, the first oxide layer and the at least one nitride island to form gate, source and drain areas;

depositing at least one channel dopant in the gate area, the at least one channel dopant being deposited in the substrate layer;

providing a silicide layer over the source and drain areas; and depositing a metal layer in the gate, source and drain areas.

2. The method for forming a totally self-aligned transistor defined in claim 1, further comprising the step of depositing an deposition oxide layer in the silicon trench above the substrate layer.

3. The method for forming a totally self-aligned transistor defined in claim 1, wherein the at least one channel dopant is deposited at a tilt angle.

4. The method for forming a totally self-aligned transistor defined in claim 3, wherein the tilt angle is derived from the arctangent of the length of the gate area divided by the height of the first nitride layer.

5. The method for forming a totally self-aligned transistor defined in claim 1, further comprising the step of depositing at least one LDD implant in the source area.

6. The method for forming a totally self-aligned transistor defined in claimed 1, further comprising the step of depositing at least one LDD implant in the drain area.

* * * * *